(12) United States Patent
Taguchi et al.

(10) Patent No.: US 6,549,196 B1
(45) Date of Patent: Apr. 15, 2003

(54) D/A CONVERSION CIRCUIT AND LIQUID CRYSTAL DISPLAY DEVICE

(75) Inventors: Takashi Taguchi, Tokyo-To (JP); Takeshi Shima, Kanagawa-Ken (JP); Tetsuro Itakura, Tokyo-To (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/401,847

(22) Filed: Sep. 22, 1999

(30) Foreign Application Priority Data

Nov. 24, 1998 (JP) .......................................... 10-332831

(51) Int. Cl.⁷ ................................................. B09G 5/00
(52) U.S. Cl. .......................... 345/210; 345/211; 345/98
(58) Field of Search ........................... 345/98, 204, 211, 345/212, 210

(56) References Cited

U.S. PATENT DOCUMENTS

| | | | |
|---|---|---|---|
| 5,929,847 A | * 7/1999 | Yanagi et al. | ................ 345/204 |
| 6,157,360 A | * 12/2000 | Jeong et al. | ................... 345/98 |
| 6,243,066 B1 | * 6/2001 | Murakami et al. | ............ 345/98 |

OTHER PUBLICATIONS

H. Minamizaki, et al., T. IEE Japan, vol. 117–C, No. 8, pp. 1028–1034, "Low Output Offset, 8–Bit Signal Driver ICS For XGA/SVGA TFT–LCDS," 1997.

* cited by examiner

*Primary Examiner*—Steven Saras
*Assistant Examiner*—Uchendu O. Anyaso
(74) *Attorney, Agent, or Firm*—Oblon, Spivak, McClelland, Maier & Neustadt, P.C.

(57) ABSTRACT

A D/A conversion circuit which can perform D/A conversion at high speed and with high precision is disclosed. The D/A conversion circuit comprises an analog reference power supply, an output buffer, a multiplexer, a pre-buffer, and a current changeover switch. The pre-buffer operates with a power supply voltage different from that of the analog reference power supply, and outputs a voltage substantially equal to an output voltage of the analog reference power supply. For a predetermined period after logic of digital data changes, the output voltage of the pre-buffer is supplied to the output buffer, and an input parasitic capacitor of the output buffer is charged/discharged. After the predetermined period elapses, the output voltage of the analog reference power supply is supplied to the output buffer. Therefore, a charging/discharging current of the input parasitic capacitor does not flow through the analog reference power supply, and fluctuation of the output voltage of the analog reference power supply can be suppressed.

22 Claims, 13 Drawing Sheets

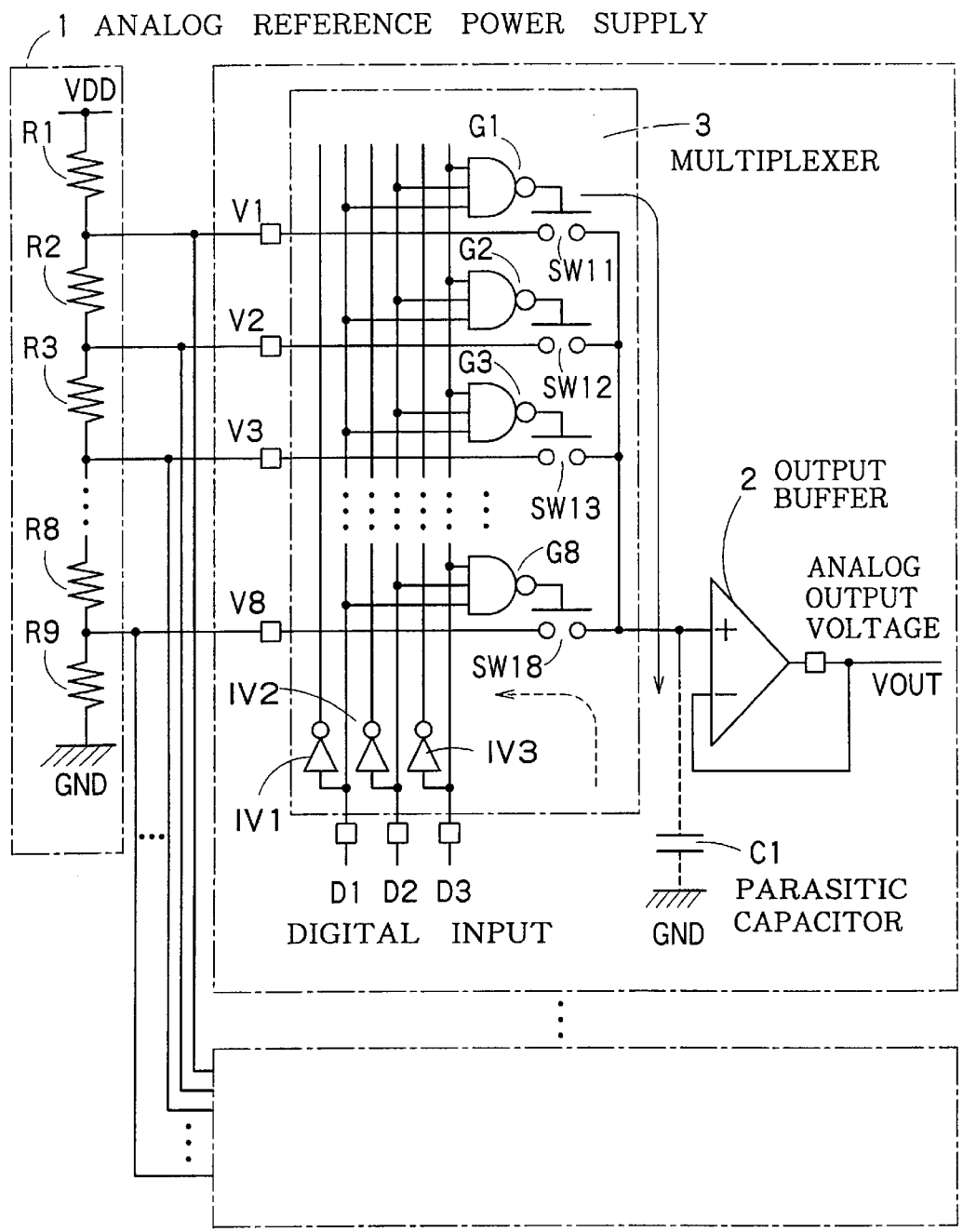
F I G. 1

| DIGITAL INPUT | | | ANALOG OUTPUT |
|---|---|---|---|
| D1 | D2 | D3 | VOUT |
| 0 | 0 | 0 | V8 |
| 0 | 0 | 1 | V7 |
| 0 | 1 | 0 | V6 |
| 0 | 1 | 1 | V5 |
| 1 | 0 | 0 | V4 |
| 1 | 0 | 1 | V3 |
| 1 | 1 | 0 | V2 |
| 1 | 1 | 1 | V1 |

F I G. 2

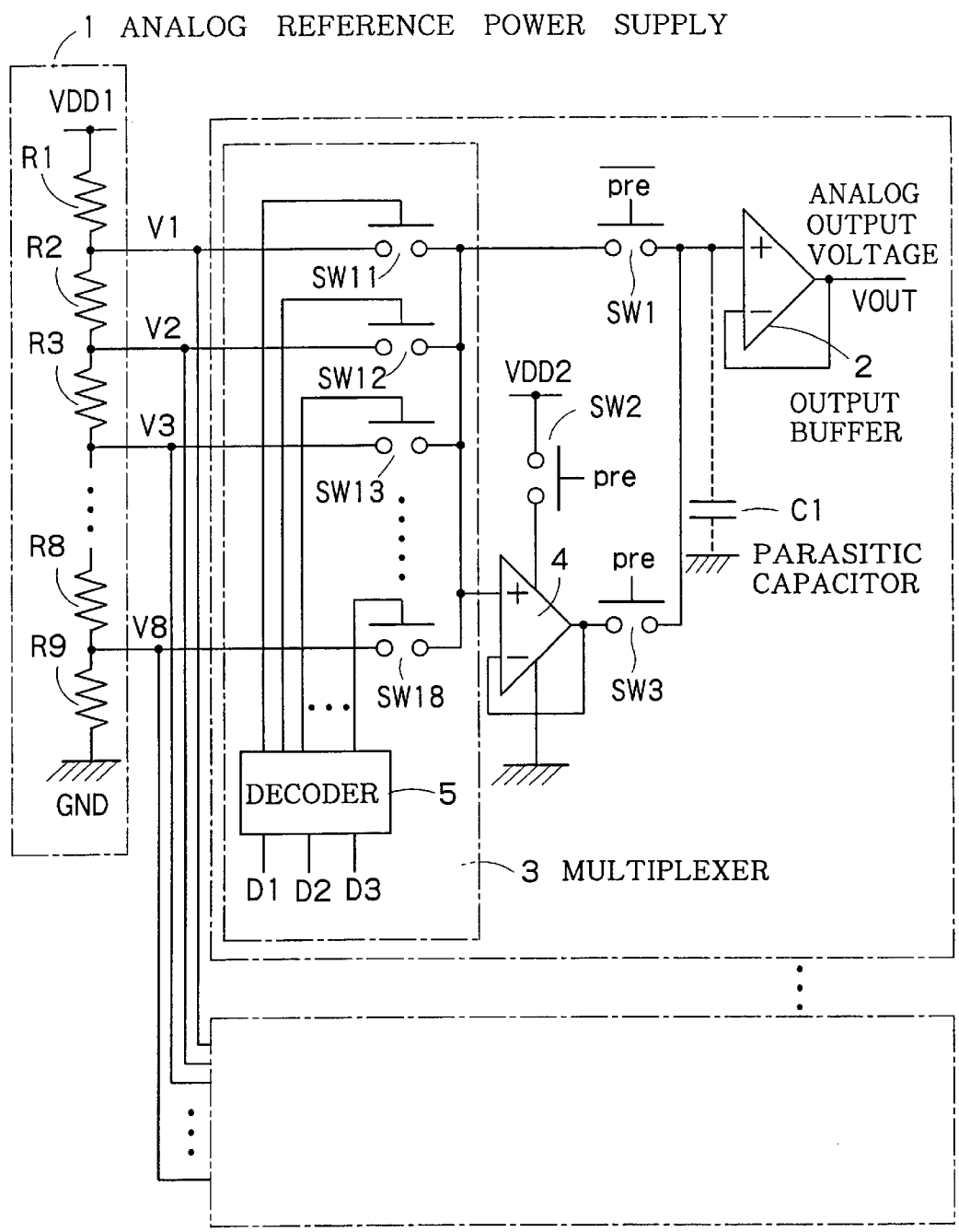
F I G. 3

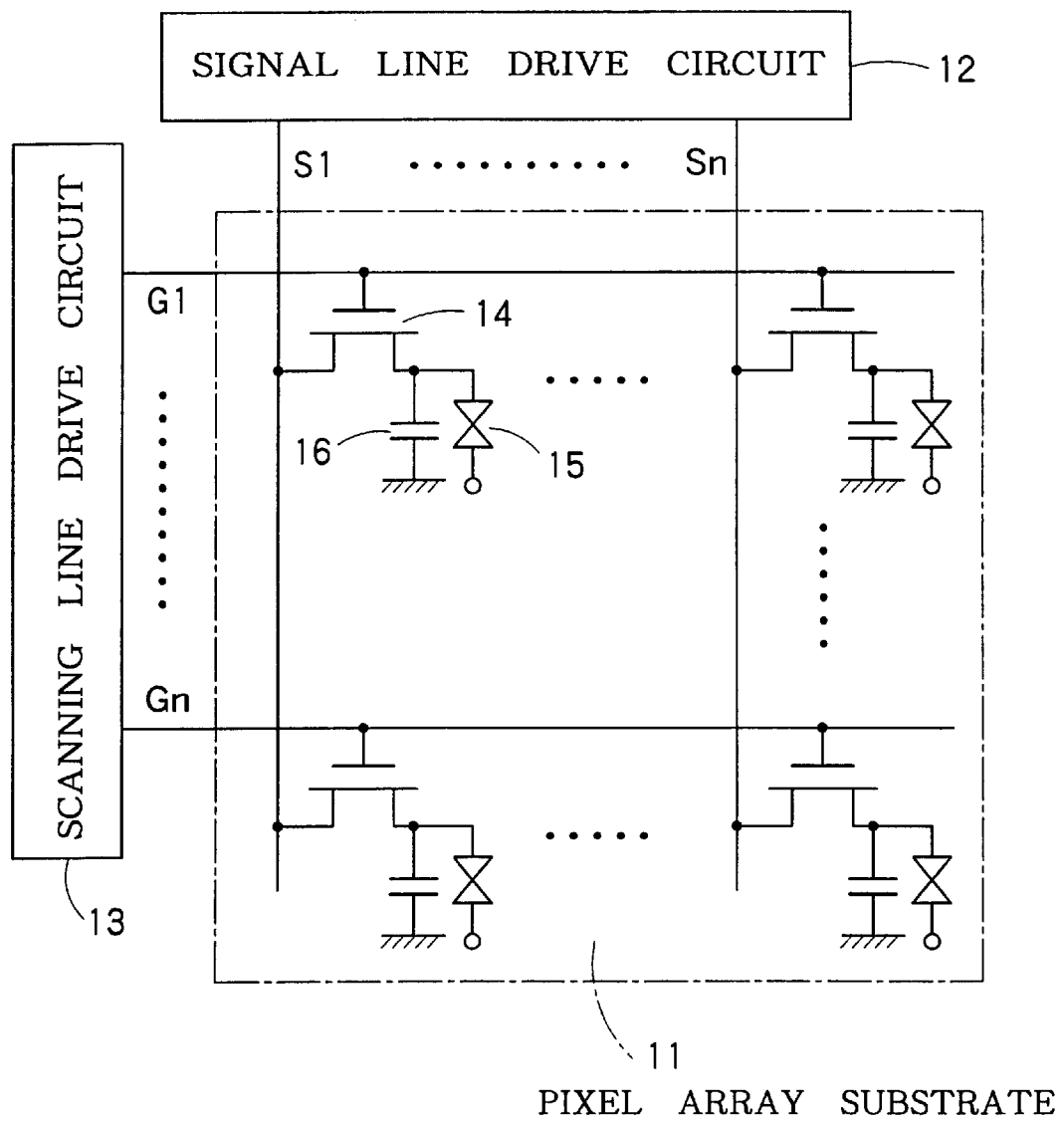
F I G. 4

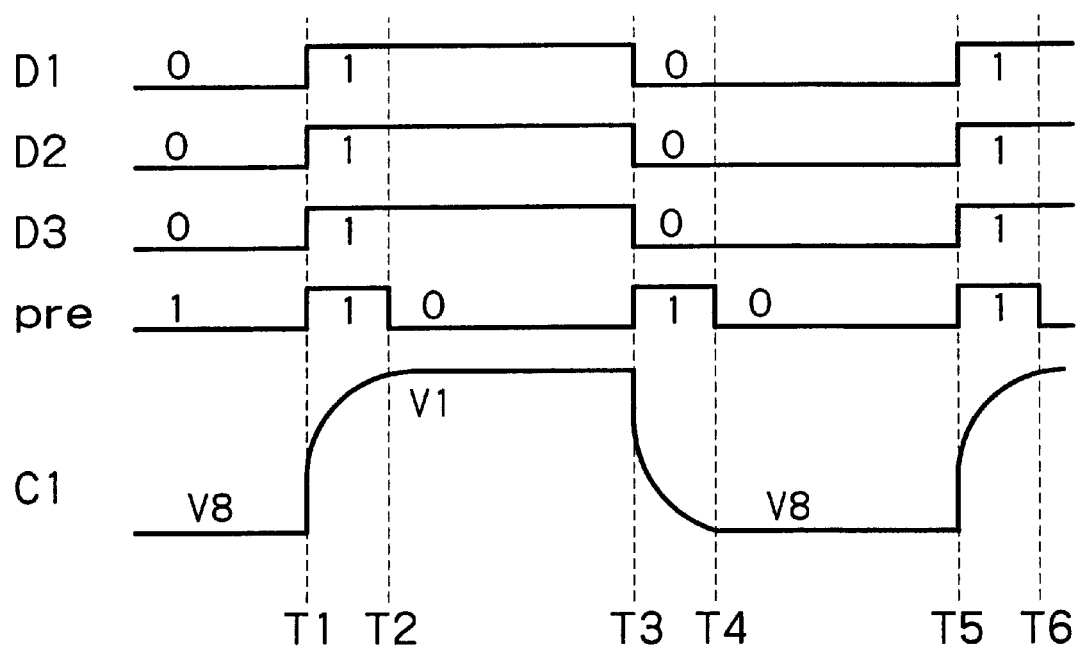
F I G. 5

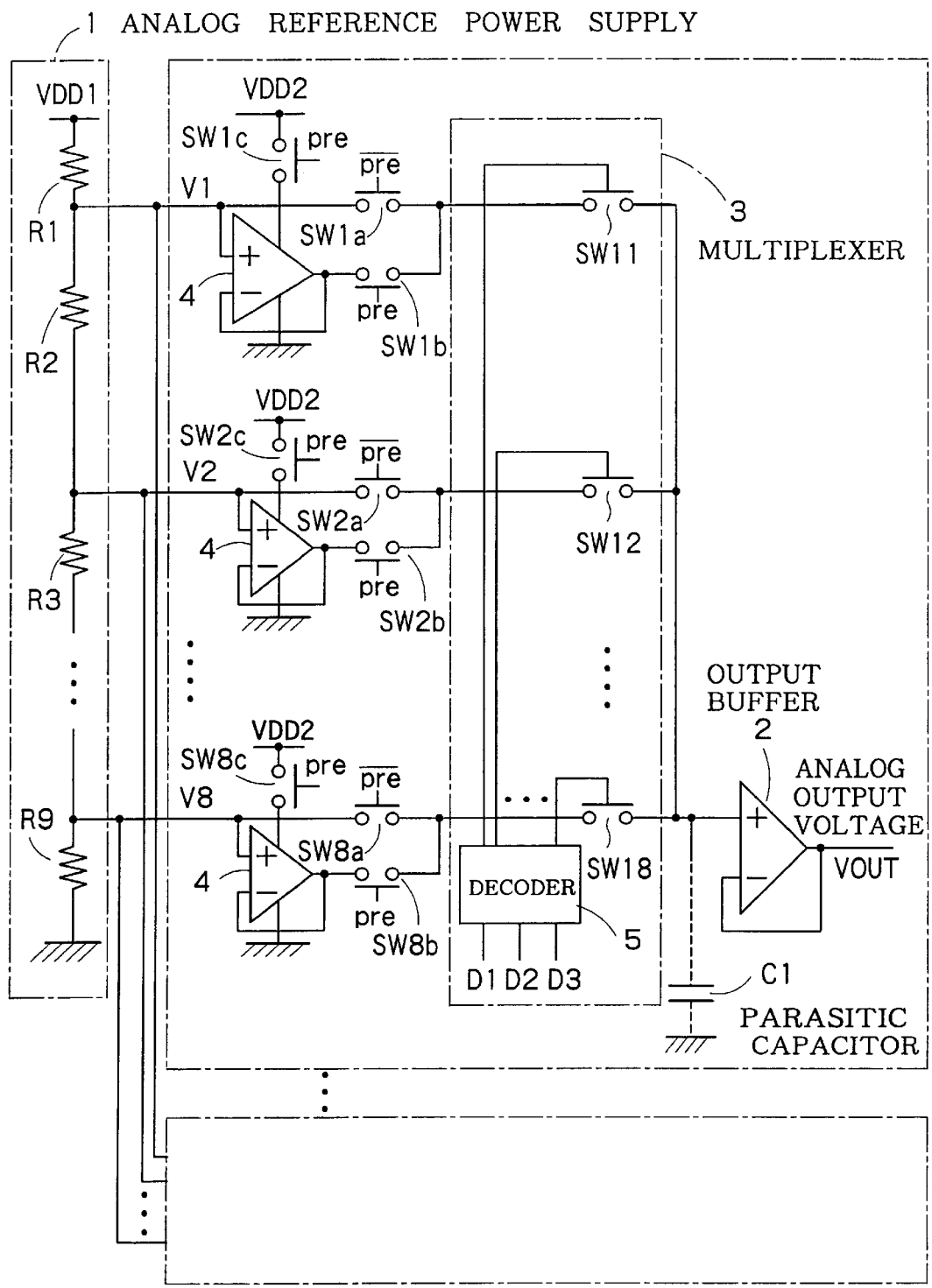
F I G. 7

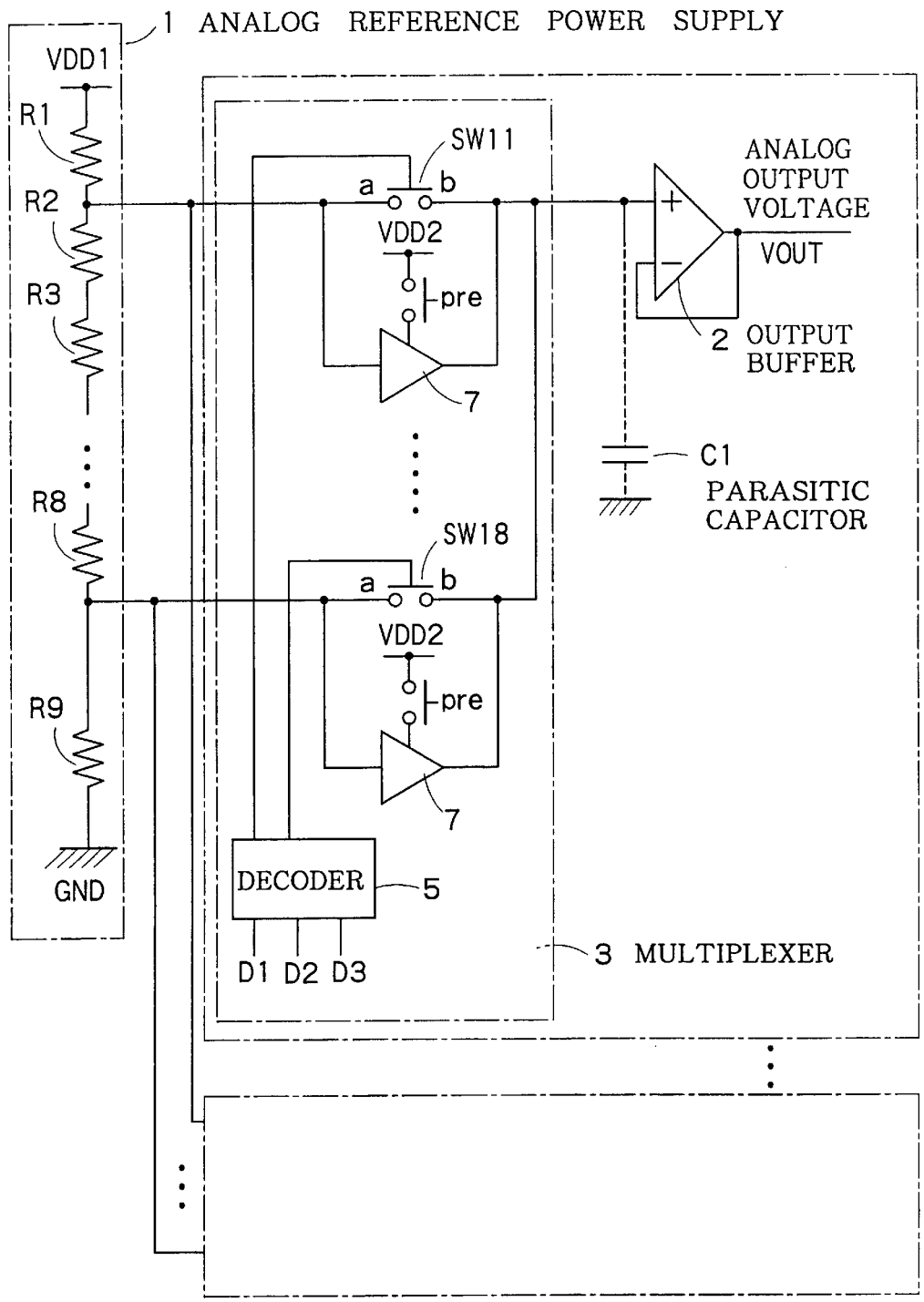
F I G. 8

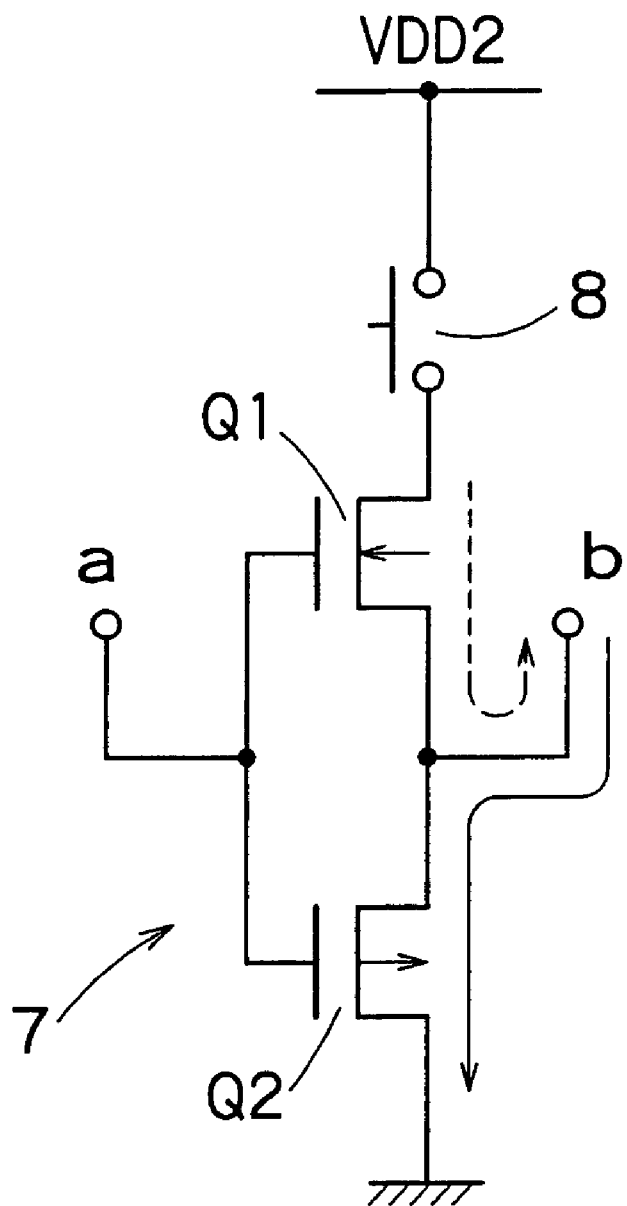
F I G. 9

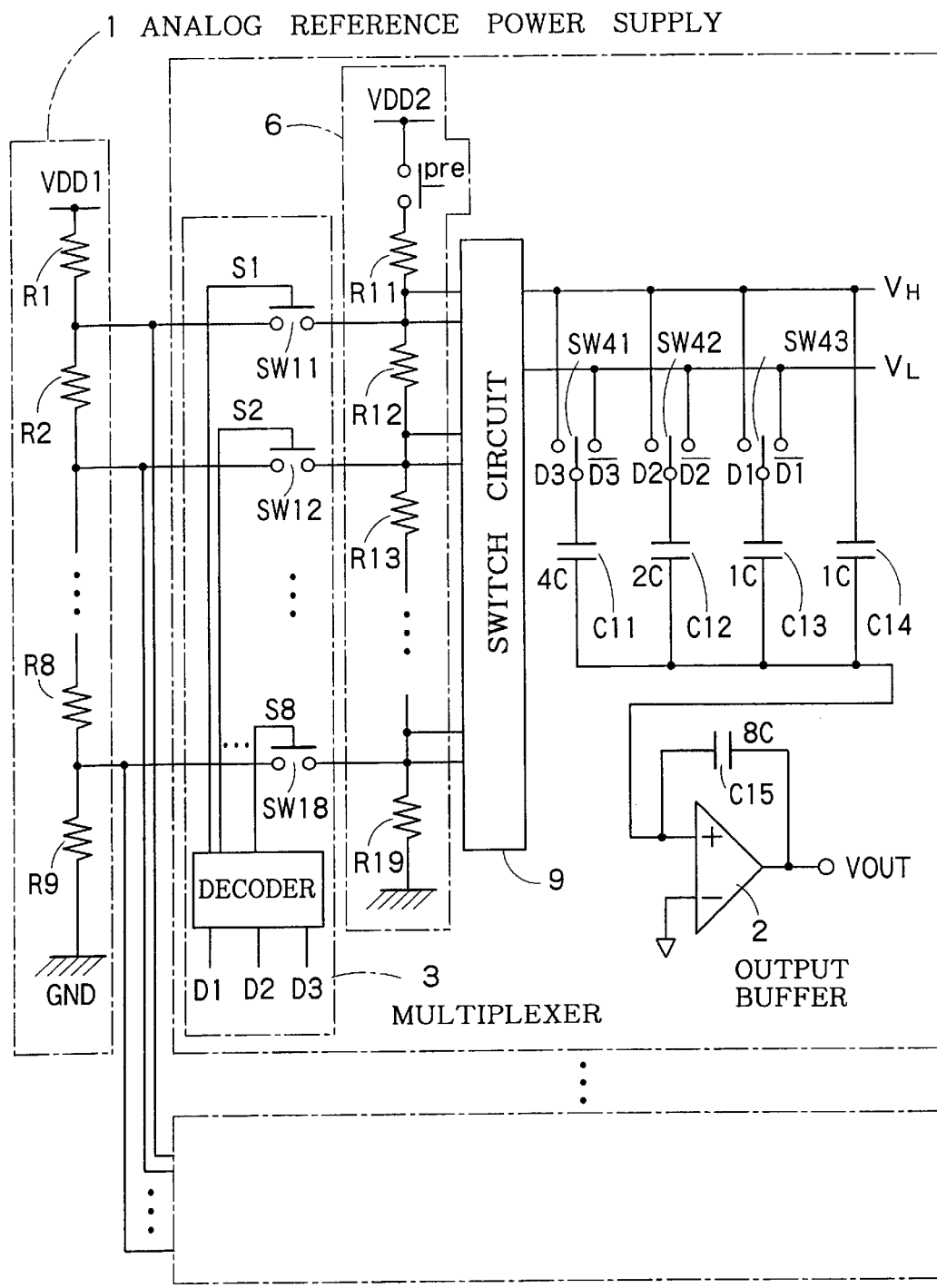
F I G. 13

D/A CONVERSION CIRCUIT AND LIQUID CRYSTAL DISPLAY DEVICE

BACKGROUND OF THE INVENTION

1. Field of the Invention

The present invention relates to a D/A conversion technique for converting digital signals to analog signals, and a target of the present invention is, for example, a D/A conversion circuit or the like for use in a circuit that drives signal lines in a pixel array substrate such as a liquid crystal display panel.

2. Related Background Art

A liquid crystal display device has a pixel array substrate in which a plurality of signal lines and scanning lines are arranged, and a drive circuit substrate in which a drive circuit for driving the signal lines and the scanning lines is formed. To reduce a mounting area, there are a case where a part of the drive circuit is formed in the pixel array substrate, and a case where the drive circuit is formed in a chip. Since the chip usually operates in a digital manner, pixel data is also treated in a digital signal state in the chip.

On the other hand, an analog pixel voltage is supplied to each signal line in the pixel array substrate so that gradation display can be accomplished. Therefore, the drive circuit is usually provided with a D/A conversion circuit for converting digital pixel data to the analog pixel voltage.

FIG. 1 is a circuit diagram of a conventional D/A conversion circuit provided in a signal line drive circuit of the liquid crystal display device. The D/A conversion circuit of FIG. 1 is equipped with an analog reference power supply 1, an output buffer 2 and a multiplexer 3, and an analog output VOUT outputted from the output buffer 2 is supplied to the corresponding signal line.

Each signal line is provided with the output buffer 2 and the multiplexer 3, respectively, and the analog reference power supply 1 is often shared. Usually, the plurality (e.g., 300 sets) of output buffers 2 and multiplexers 3 are collectively formed in an LSI chip.

The analog reference power supply 1 divides a power supply voltage VDD into resistance voltages so as to output a plurality of different voltages. The multiplexer 3 selects any one of the voltages outputted from the analog reference power supply 1 in accordance with a logic of digital pixel data D1 to D3 inputted from the outside. The output buffer 2 buffers the voltage outputted from the multiplexer 3, i.e., outputs a voltage that an impedance is converted. The output of the output buffer 2 is supplied to a pixel array substrate (not shown) outside the LSI chip.

FIG. 1 shows an example in which the number of bits of the digital pixel data D1 to D3 is three, and the multiplexer 3 selects one from eight types of voltages outputted from the analog reference power supply 1.

The multiplexer 3 has NAND gates G1 to G8, inverters IV1 to IV3, and switches SW11 to SW18. The inverters IV1 to IV3 are provided for each bit of the digital pixel data D1 to D3, and the switches SW11 to SW18 are provided for the NAND gates G1 to G8, respectively.

FIG. 2 is a diagram explaining voltage selection of the multiplexer 3. As shown in the drawing, the multiplexer 3 selects different voltages in accordance with a bit string of the digital pixel data D1 to D3. For example, when the bit string of the digital pixel data D1 to D3 is (0, 0, 0), an output of the NAND gate G8 of FIG. 1 is placed in a low level; as a result, the switch SW8 is turned on, and voltage V8 is supplied to the output buffer 2.

The D/A conversion circuit of FIG. 1 has a defect that the voltage outputted from the analog reference power supply 1 fluctuates. The defect will be described hereinafter in detail.

Here, a case where the voltages V1 and V8 are alternately selected from the voltages outputted from the analog reference power supply 1 of FIG. 1 will be described.

An equivalent input parasitic capacitor C1 is attached to an input terminal of the output buffer 2, and the input parasitic capacitor C1 is charged with an electric charge corresponding to the voltage selected by the multiplexer 3. For example, when the bit string of the digital pixel data D1 to D3 inputted to the multiplexer 3 is (1, 1, 1), the voltage V1 which is a maximum voltage is supplied to the output buffer 2, and the parasitic capacitor C1 is charged by the voltage V1. FIG. 1 shows an electric charging route with a solid-line arrow.

Subsequently, when the bit string of the digital pixel data D1 to D3 changes to (0, 0, 0), the voltage V8 which is a minimum voltage is supplied to the output buffer 2. Immediately before the bit string changes to (0, 0, 0), the parasitic capacitor C1 is charged with the voltage V1. Therefore, the electric charge added to the parasitic capacitor C1 is discharged through a route of a dotted line of FIG. 1.

Such movement of the electric charge can be treated as a direct current, and the direct current can be represented by equation (1).

$$I = Cx(V8-V1)/T \quad (1)$$

In the equation (1), T denotes a period in which the voltage is switched over. The shorter the period is, the more direct current flows in the analog reference power supply. For example, when a frequency as an inverse number of T is set to F, the following equation (2) is established:

$$I = Cx(V8-V1) \times F \quad (2)$$

In this manner, when the voltage selected by the multiplexer 3 changes to a high voltage from a low voltage, the input parasitic capacitor C1 of the output buffer 2 is charged. Conversely, when the voltage selected by the multiplexer 3 changes to a low voltage from a high voltage, the input parasitic capacitor of the output buffer 2 is discharged.

The electric current for charging/discharging the input parasitic capacitor C1 flows the analog reference power supply 1. That is, when the voltage selected by the multiplexer 3 changes to a high voltage from a low voltage, the charging current flows to the input parasitic capacitor C1 from the analog reference power supply 1, and the output voltage of the analog reference power supply 1 is lowered. Conversely, when the voltage selected by the multiplexer 3 changes to a low voltage from a high voltage, the current discharged from the input parasitic capacitor C1 flows into the analog reference power supply 1, and the output voltage of the analog reference power supply 1 is raised.

When the output voltage of the analog reference power supply 1 fluctuates, the analog output VOUT outputted from the D/A conversion circuit of FIG. 1 also fluctuates, and precision of D/A conversion is worsened. Therefore, when such D/A conversion circuit is used in the signal line drive circuit of the liquid crystal display device, no desired analog pixel voltage is supplied to the signal line, and display quality is worsened. Specifically, an influence of a specific display pattern is exerted, and cross talk occurs. Moreover, even when the analog reference power supply 1 of FIG. 1 is provided inside the LSI chip, the similar problem arises.

The D/A conversion circuit of so-called resistance dividing type has been described above in which a plurality of different voltages are outputted from a plurality of resistances connected in series. In a D/A conversion circuit of so-called capacity dividing type in which a plurality of different voltages are outputted from a plurality of capacitors connected in series or parallel, a plurality of capacitors have to be charged/discharged directly from the analog reference power supply. Therefore, as compared with the resistance dividing type, the electric current flowing through the analog reference power supply is increased, and the output voltage of the analog reference power supply fluctuates more largely. Furthermore, the cross talk by the influence of the specific display pattern also becomes larger as compared with that of the resistance dividing type.

SUMMARY OF THE INVENTION

The present invention has been developed in consideration of the above-described respects, and an object thereof is to provide a D/A conversion circuit which can perform D/A conversion at high speed and with high precision.

To attain the above object, a D/A conversion circuit provided with an analog reference power supply for using a first power supply voltage as a drive voltage and outputting a plurality of different voltages,
- a voltage selecting circuit for selecting one voltage of voltages correlated with the plurality of different voltages, and
- an output buffer for converting impedance of the voltage selected by the voltage selecting circuit, comprises:
  - a charging/discharging voltage generating circuit for using a second power supply voltage as the drive voltage and outputting voltages correlated with the output voltages of the analog reference power supply; and
  - a current switchover circuit for switching a direction in which a current flows in such a manner that a charging/discharging current of an input parasitic capacitor of the output buffer passes through the charging/discharging voltage generating circuit within a predetermined period after a bit string of digital data changes, and the charging/discharging current passes through the analog reference power supply after the predetermined period elapses.

According to the present invention, since the charging/discharging voltage generating circuit is provided in such a manner that the current for charging/discharging the input parasitic capacitor of the output buffer of the D/A conversion circuit fails to flow through the analog reference power supply, the output voltage of the analog reference power supply is prevented from fluctuating, and the precision of the D/A conversion can be improved. Moreover, by lowering an output impedance of the charging/discharging voltage generating circuit, it is possible to charge and discharge the input parasitic capacitor of the output buffer at high speed, and to perform the D/A conversion at high speed. Particularly, when the D/A conversion of a capacity dividing type is performed, the charging/discharging current during the D/A conversion is large. Therefore, by providing the charging/discharging voltage generating circuit, the fluctuation of the output voltage of the analog reference power supply can surely be suppressed, and the D/A conversion can be performed at higher speed and with higher precision than the conventional art.

BRIEF DESCRIPTION OF THE DRAWING

FIG. 1 is a circuit diagram of a conventional D/A conversion circuit provided in a signal line drive circuit of a liquid crystal display device.

FIG. 2 is an explanatory view of voltage selection of the multiplexer 3.

FIG. 3 is a circuit diagram of a first embodiment of a D/A conversion circuit according to the present invention.

FIG. 4 is a block diagram of a liquid crystal display device which has the D/A conversion circuit of FIG. 3 inside.

FIG. 5 is a timing chart showing an operation timing of each portion of the circuit of FIG. 3.

FIG. 7 is a circuit diagram of a third embodiment of the D/A conversion circuit according to the present invention.

FIG. 8 is a circuit diagram of a fourth embodiment of the D/A conversion circuit according to the present invention.

FIG. 9 is a circuit diagram showing an inner constitution of a buffer 7.

FIG. 13 is a diagram showing an example in which the resistance voltage dividing circuit and a switch circuit are provided behind the multiplexer.

DESCRIPTION OF THE PREFERRED EMBODIMENTS

Figure 6:
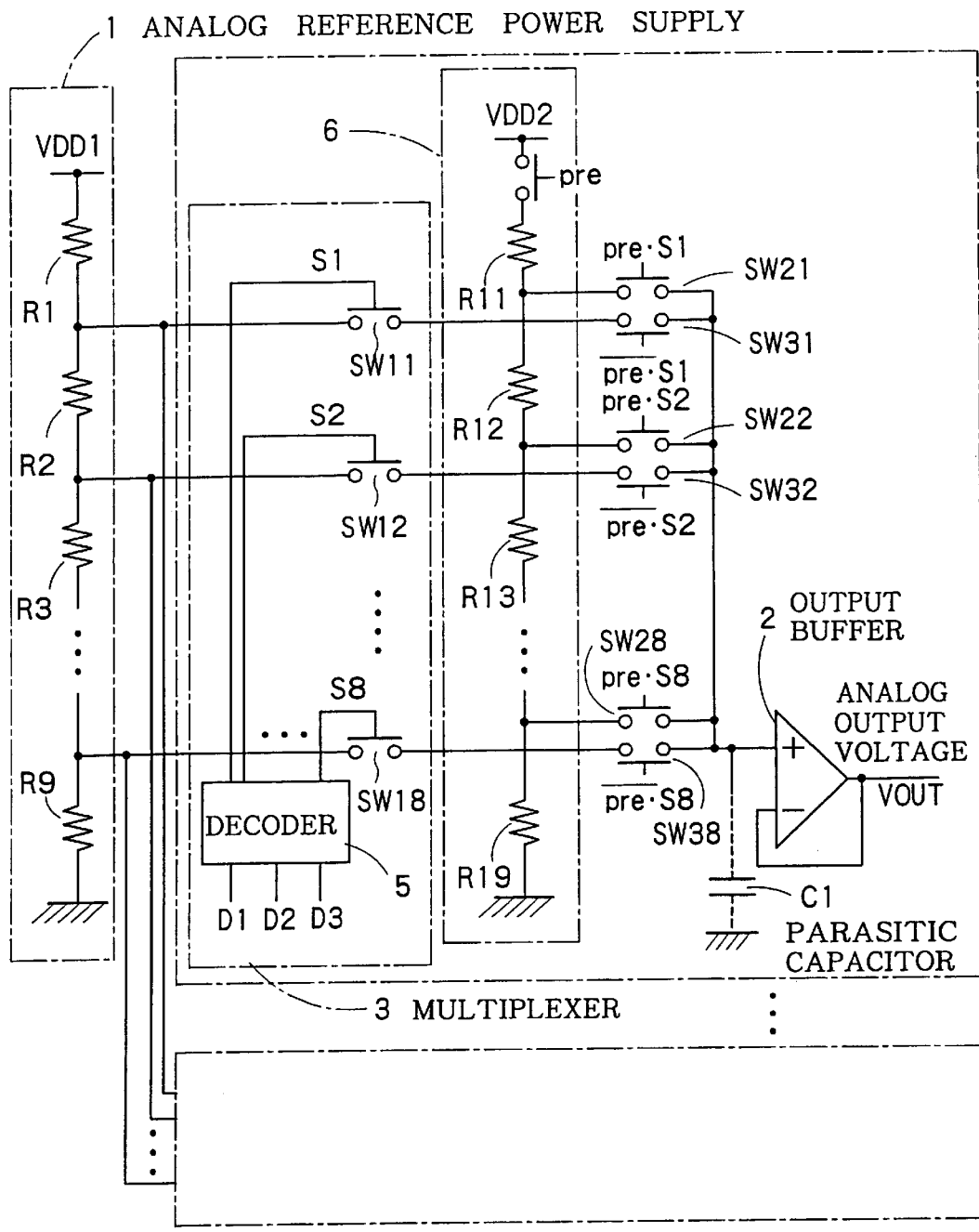
FIG. 6 is a circuit diagram of a second embodiment of the D/A conversion circuit.

A D/A conversion circuit of the present invention will concretely be described hereinafter with reference to the drawings. As an example of the D/A conversion circuit, a D/A conversion circuit for driving a liquid crystal display device will be described below.

First Embodiment

FIG. 3 is a circuit diagram of a first embodiment of the D/A conversion circuit according to the present invention, and FIG. 4 is a block diagram of the liquid crystal display device which has therein the D/A conversion circuit of FIG. 3. First, the liquid crystal display device of FIG. 4 will be described before explaining of FIG. 3.

The liquid crystal display device of FIG. 4 is provided with a pixel array substrate 11 in which signal lines and scanning lines are arranged in matrix, a signal line drive circuit 12 for driving each signal line, and a scanning line drive circuit 13 for driving each scanning line. Pixel TFTs 14 are formed in the vicinity of each intersection of the signal lines and the scanning lines in the pixel array substrate 11. Each of the scanning line is connected to a gate terminal of the pixel TFTs 14, each of the signal line is connected to one of drain and source terminals of the pixel TFTs 14, and a liquid crystal capacity 15 and an auxiliary capacity 16 are connected to the other terminal.

At least one of the signal line drive circuit 12 and the scanning line drive circuit 13 may be formed on the pixel array substrate 11.

The D/A conversion circuit of FIG. 3 is provided in an output stage of the signal line drive circuit 12. In the same manner as the conventional D/A conversion circuit (FIG. 1), the D/A conversion circuit of FIG. 3 is provided with the analog reference power supply 1 which outputs a plurality of different voltages for D/A conversion, the output buffer 2 which performs impedance conversion, and the multiplexer (voltage selecting circuit) 3. Additionally, the D/A conversion circuit of FIG. 3 has a pre-buffer (charging/discharging voltage generating circuit) 4 for use in charging/discharging the input parasitic capacitor C1 of the output buffer 2, and current changeover switches (current switchover circuit) SW1, SW2 and SW3.

Each signal line is provided with the output buffer 2, multiplexer 3, pre-buffer 4 and current changeover switches SW1 to SW3, but the analog reference power supply 1 is shared by the plurality of signal lines. Specifically, one analog reference power supply 1 is connected to about 300 sets of output buffers 2, multiplexers 3, pre-buffers 4 and current changeover switches SW1 to SW3. These 300 sets of output buffers 2, multiplexers 3, pre-buffers 4 and current changeover switches SW1 to SW3 are usually formed in one LSI chip. The analog reference power supply 1 may be formed in the LSI chip or provided outside the chip.

As shown in FIG. 3, the multiplexer 3 has switches SW11 to SW18 provided for the voltages outputted from the analog reference power supply 1, and a decoder 5 for controlling on/off states of these switches SW11 to SW18. FIG. 3 shows an example in which one voltage is selected from eight types of voltages based on logic of digital pixel data D1 to D3 of three bits. One of the switches SW11 to SW18 is turned on in accordance with output logic of the decoder 5, and the corresponding voltage is supplied to the pre-buffer 4 and the current changeover switch SW1.

A non-inversion input terminal of the pre-buffer 4 is connected to an output terminal of the multiplexer 3, and an inversion input terminal is connected to an output terminal of the pre-buffer 4. The pre-buffer 4 performs feedback control in such a manner that a voltage substantially equal to a voltage applied to the non-inversion input terminal is outputted. Only when a pre-signal is in a high level, power supply voltage VDD2 is supplied to the pre-buffer 4. The power supply voltage VDD2 is different from a power supply voltage VDD1. The pre-signal is placed in the high level only for a predetermined period after the bit string of the digital pixel data D1 to D3 changes.

Since the signal line drive circuit 12 in the liquid crystal display device is usually provided beforehand with a load signal which acts as a timing signal for switching a pixel. Therefore, the load signal may also be used as the pre-signal, or the pre-signal may be generated based on the load signal.

The current changeover switch SW1 or SW3 selects one of outputs of the multiplexer 3 and the pre-buffer 4 in accordance with logic of the pre-signal, and supplies the output to the output buffer 2. Specifically, when the pre-signal is in the high level, that is, only for the predetermined period after the bit string of the digital pixel data D1 to D3 changes, the output of the pre-buffer 4 is supplied to the output buffer 2. When the pre-signal is in a low level, the output of the multiplexer 3 is supplied to the output buffer 2.

FIG. 5 is a timing chart showing an operation timing of each portion of the circuit of FIG. 3. FIG. 5 shows an example in which the bit string of the digital pixel data D1 to D3 changes to (1, 1, 1) at time T1, changes to (0, 0, 0) at time T3, and changes to (1, 1, 1) at time T5.

The operation of the circuit of FIG. 3 will be described below with reference to the timing chart of FIG. 5. Since the digital pixel data D1 to D3 is (0, 0, 0) before the time T1, the multiplexer 3 selects the minimum voltage V8 as shown in FIG. 2. Moreover, since the pre-signal is in the low level before the time T1, the power supply voltage VDD2 is not supplied to the pre-buffer 4, and the current changeover switch SW1 or SW3 selects the output (voltage V8) of the multiplexer 3 and supplies the output to the output buffer 2.

At the time T1, the digital pixel data D1 to D3 changes to (1, 1, 1), and the multiplexer 3 selects the maximum voltage V1 as shown in FIG. 2. Moreover, the pre-signal is set to the high level for the predetermined period (period of time T1 to T2) after the change of the digital pixel data D1 to D3, the power supply voltage VDD2 is supplied to the pre-buffer 4, and the pre-buffer 4 outputs a voltage of substantially the same level as that of the voltage V1. In this period, the current changeover switch SW1 or SW3 selects the output of the pre-buffer 4 and supplies the output to the output buffer 2.

As described above, since the input parasitic capacitor C1 is attached to the input terminal of the output buffer 2, the parasitic capacitor C1 is charged by the voltage V1 outputted from the pre-buffer 4. During the charging, a charging current flows to the input parasitic capacitor C1 from the pre-buffer 4. The charging current is supplied not from the power supply voltage VDD1 of the analog reference power supply 1, but from the power supply voltage VDD2 of the pre-buffer 4. Since it takes a certain degree of time to charge the parasitic capacitor C1, the input voltage of the output buffer 2 is moderately raised as shown in FIG. 5. However, when the output impedance of the pre-buffer 4 is lowered, the input parasitic capacitor can be charged in a shorter time than before, and a high speed D/A conversion operation can be realized.

Subsequently, since in a period of time T2 to T3, the pre-signal is in the low level, no power supply voltage VDD2 is supplied to the pre-buffer 4, and the current changeover switch SW1 and SW3 supply the output voltage V1 of the multiplexer 3 to the output buffer 2. In the period, since the charging of the parasitic capacitor C1 is already completed, no charging current flows to the parasitic capacitor C1 from the analog reference power supply 1, and the output voltage of the analog reference power supply 1 hardly fluctuates.

Subsequently, at time T3, the digital pixel data D1 to D3 change to (0, 0, 0) again, and the multiplexer 3 outputs the minimum voltage V8. Moreover, in a period of time T3 to T4, the pre-signal is placed in the high level, the power supply voltage VDD2 is supplied to the pre-buffer 4, the pre-buffer 4 outputs a voltage of substantially the same level as that of the voltage V8, and the current changeover switch SW1 and SW3 supply the output voltage of the pre-buffer 4 to the output buffer 2.

The parasitic capacitor C1 is charged with the voltage V1 till the time T3. Therefore, when the output voltage of the pre-buffer 4 lowers to V8 at the time T3, the parasitic capacitor C1 is discharged. The discharged current flows through the pre-buffer 4 from the current changeover switch SW3. Therefore, as shown in FIG. 5, the input voltage of the output buffer 2 rapidly lowers, and substantially reaches the voltage V8 at time T4.

Subsequently, since in a period of time T4 to T5, the pre-signal is in the low level, the current changeover switch SW1 or SW3 supplies the output voltage V8 of the multiplexer 3 to the output buffer 2. In the period, since the charging of the parasitic capacitor C1 is already completed, no discharged current flows through the analog reference power supply 1 from the parasitic capacitor C1, and fluctuation of the output voltage of the analog reference power supply 1 can be suppressed.

As described above, in the first embodiment, there is provided the pre-buffer 4 which outputs the voltage of substantially the same level as that of the output voltage of the analog reference power supply 1. The output of the pre-buffer 4 is supplied to the input terminal of the output buffer 2 only for the predetermined period after the bit string of the digital pixel data D1 to D3 changes. Therefore, the current to charge/discharge the input parasitic capacitor C1 of the output buffer 2 flows to the pre-buffer 4, instead of the analog reference power supply 1. Accordingly, the output voltage of the analog reference power supply 1 is prevented from fluctuating. Moreover, since the pre-buffer 4 is used, the input parasitic capacitor C1 of the output buffer 2 can be charged/discharged at high speed.

Second Embodiment

In a second embodiment, instead of the pre-buffer 4, a resistance voltage dividing circuit is provided for charging/discharging the parasitic capacitor Cl.

FIG. 6 is a circuit diagram of the second embodiment of the D/A conversion circuit. In FIG. 6, constituting portions common with those of FIG. 3 are denoted by the same reference numerals, and different respects will mainly be described hereinafter.

In addition to the analog reference power supply 1, output buffer 2, multiplexer 3, and current changeover switches SW21 to SW28, SW31 to SW38, the D/A conversion circuit of FIG. 6 has a charging/discharging resistance voltage dividing circuit (charging/discharging voltage generating circuit) 6. Each signal line is provided with the output buffer 2, multiplexer 3, current changeover switches SW1 to SW3 and charging/discharging resistance voltage dividing circuit 6.

In the same manner as the analog reference power supply 1, the charging/discharging resistance voltage dividing circuit 6 has a plurality of resistances R11 to R19 connected in series, and outputs a voltage dividing the power supply voltage VDD2 from between adjacent resistances. An output voltage level of the charging/discharging resistance voltage dividing circuit 6 is the same as an output voltage level of the analog reference power supply 1.

Each of the current changeover switches SW21 to SW28, SW31 to SW38 selects one of the output voltage of the analog reference power supply 1 and the corresponding output voltage of the charging/discharging resistance voltage dividing circuit 6 in accordance with the logic of the pre-signal and decoded result of the decoder 5 in the multiplexer 3. Specifically, when the pre-signal and the output of the decoder 5 are both in the high level, the output voltage of the charging/discharging resistance voltage dividing circuit 6 is supplied to the output buffer 2. When the pre-signal is in the low level and the output of the decoder 5 is in the high level, the output voltage of the analog reference voltage is supplied to the output buffer 2. Moreover, when the output of decoder 5 is in the low level, neither the output voltage of the analog reference voltage nor the output voltage of the charging/discharging resistance voltage dividing circuit 6 is supplied to the output buffer 2.

The operation of the D/A conversion circuit of FIG. 6 will next be described. Within the predetermined period after the bit string of the digital pixel data D1 to D3 changes, the pre-signal is in the high level. Therefore, in accordance with the bit string of the digital pixel data D1 to D3, one of the switches SW11 to SW18 in the multiplexer 3 is turned on, and additionally only one of the current changeover switches SW21 to SW28, SW31 to SW38 is turned on. Therefore, one of the output voltages of the charging/discharging resistance voltage dividing circuit 6 is supplied to the output buffer 2, and by the voltage, the parasitic capacitor C1 of the input terminal of the output buffer 2 is charged.

When the predetermined period elapses after the bit string of the digital pixel data D1 to D3 changes, the pre-signal is in the low level, and the output voltage of the analog reference power supply 1 is supplied to the output buffer 2 via the current changeover switches SW21 to SW28 and SW31 to SW38.

Subsequently, when the bit string of the digital pixel data D1 to D3 changes again, the pre-signal is in the high level only for the predetermined period. In the predetermined period, in accordance with the decoded result of the decoder 5, one of the output voltages of the charging/discharging resistance voltage dividing circuit 6 is supplied to the output buffer 2. When the voltage is higher than the voltage previously supplied to the output buffer 2, the parasitic capacitor C1 is charged. Conversely, when the voltage is lower than the voltage supplied to the output buffer 2, the electric charge is discharged from the parasitic capacitor Cl. The charging/discharging current flows through the charging/discharging resistance voltage dividing circuit 6, instead of the analog reference power supply 1. Therefore, in the same manner as the first embodiment, the output voltage of the analog reference power supply 1 does not fluctuate.

In FIG. 6, a resistance ratio of resistances R1 to R9 in the analog reference power supply 1 is preferably set to be substantially equal to a resistance ratio of resistances R11 to R19 in the charging/discharging resistance voltage dividing circuit 6. By equalizing both resistance ratios, the output voltages of the analog reference power supply 1 can be equalized with the output voltages of the charging/discharging resistance voltage dividing circuit 6. However, even if both resistance ratios differ from each other, an effect of the present invention that the charging/discharging resistance voltage dividing circuit 6 can charge/discharge the input parasitic capacitor C1 of the output buffer 2 can be obtained.

Moreover, in order to charge/discharge the input parasitic capacitor C1 at high speed while suppressing power consumption of the circuit, resistance values of the resistances R11 to R19 in the charging/discharging resistance voltage dividing circuit 6 are preferably set to be smaller than resistance values of the resistances R1 to R9 in the analog reference power supply 1.

Third Embodiment

In a third embodiment, the pre-buffer 4 is provided between the analog reference power supply 1 and the multiplexer 3.

FIG. 7 is a circuit diagram of the third embodiment of the D/A conversion circuit according to the present invention. In FIG. 7, constituting portions common with those of FIG. 3 are denoted by the same reference numerals.

The D/A conversion circuit of FIG. 7 is characterized in that the pre-buffers 4 are connected between the analog reference power supply 1 and the multiplexer 3. The pre-buffers 4 are provided for output terminals of the analog reference power supply 1. In the same manner as the pre-buffer 4 of FIG. 3, the power supply voltage VDD2 is supplied to these pre-buffers 4 only when the pre-signal is in the high level.

The operation of the D/A conversion circuit of FIG. 7 will next be described. The pre-signal is in the high level for the predetermined period after the bit string of the digital pixel data D1 to D3 changes. Each pre-buffer 4 outputs the voltage which is substantially equal to the output voltage of the analog reference power supply 1. Therefore, the current which allows the parasitic capacitor C1 of the input terminal of the output buffer 2 to charge/discharge flows through the pre-buffers 4, instead of the analog reference power supply 1. In the same manner as the first and second embodiments, the output voltage of the analog reference power supply 1 does not fluctuate.

Fourth Embodiment

A fourth embodiment provides a charging/discharging preamplifier in the multiplexer, in order to simplify the circuit configuration.

FIG. 8 is a circuit diagram of the fourth embodiment of the D/A conversion circuit according to the present invention. In FIG. 8, constituting portions common with those of FIG. 3 are denoted by the same reference numerals, and different respects will mainly be described hereinafter.

The D/A conversion circuit of FIG. 8 is provided with the analog reference power supply 1, output buffer 2, and multiplexer 3. Inside the multiplexer 3, there are provided the decoder 5, selecting switches SW11 to SW18 connected to the output voltages of the analog reference power supply 1, and buffers 7 connected in parallel with the selecting switches SW11 to SW18 are provided.

FIG. 9 is a circuit diagram showing an inside configuration of the buffer 7. Between the power supply voltage VDD2 and a ground terminal, a power supply switch (power supply switch circuit) 8, NMOS transistor Q1 and PMOS transistor Q2 are connected in series. Gate terminals of the transistors Q1 and Q2 are connected in common to one end of the selecting switches SW11 to SW18, and source terminals of the transistors Q1 and Q2 are connected in common to the other end of the selecting switches SW11 to SW18.

The power supply switch 8 is in ON state only for the predetermined period after the bit string of the digital pixel data D1 to D3 changes. When the power supply switch 8 is turned on, and the voltage of one terminal a of the selecting switches SW11 to SW18 is lower than the voltage of the other end b, the electric charge accumulated in the input parasitic capacitor C1 of the output buffer 2 passes through the NMOS transistor Q2 and is discharged to the ground terminal, as shown by a solid-line arrow of FIG. 9. On the other hand, when the power supply switch 8 is on, and the voltage of one end a of the selecting switches SW11 to SW18 is higher than the voltage of the other end b, the electric charge passes through the PMOS transistor Q2, and the input parasitic capacitor C1 is charged with the electric charge.

In this manner, the buffers 7 are connected in parallel with the selecting switches SW11 to SW18 in the decoder 5, and these buffers 7 are driven only for the predetermined period after the bit string of the digital pixel data D1 to D3 changes, whereby the current to charge/discharge the input parasitic capacitor C1 of the output buffer 2 flows through the buffers 7 without flowing through the analog reference power supply 1. Therefore, in the same manner as the first to third embodiments, the output voltage of the analog reference power supply 1 does not fluctuate.

Fifth Embodiment

In a fifth embodiment, D/A conversion is performed by dividing capacity.

Figure 10:
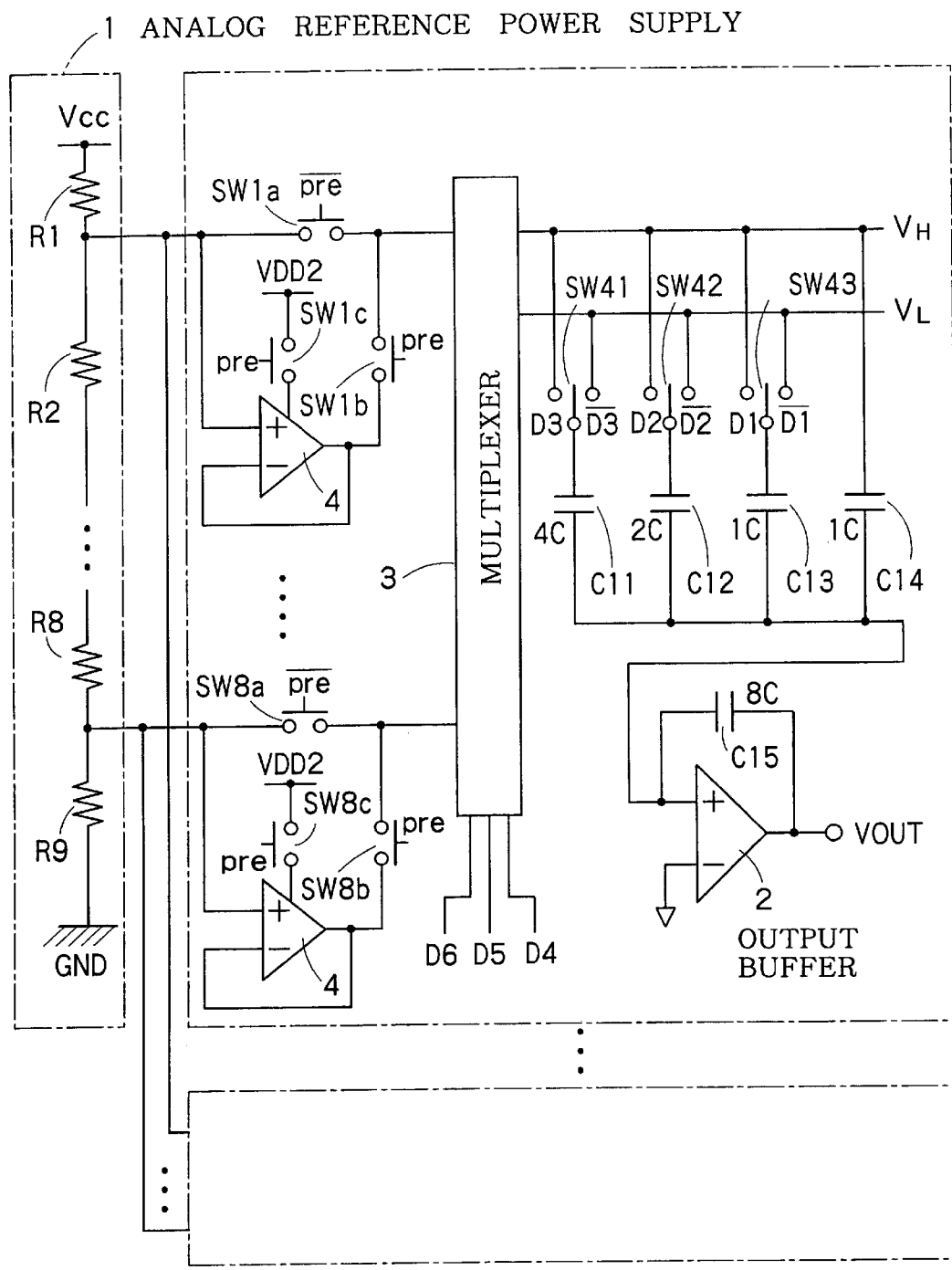
FIG. 10 is a circuit diagram of a fifth embodiment of the D/A conversion circuit according to the present invention.

FIG. 10 is a circuit diagram of the fifth embodiment of the D/A conversion circuit according to the present invention. In FIG. 10, constituting portions common with those of FIG. 3 are denoted by the same reference numerals.

The D/A conversion circuit of FIG. 10 has the analog reference power supply 1, the output buffer 2, the multiplexer 3, a plurality of capacitors C11 to C14 connected in parallel, and capacity selecting switches SW41 to SW43 for switching whether or not to select any of the capacitors C11 to C14. Moreover, in the same manner as in FIG. 7, a plurality of pre-buffers 4 are provided for output terminals of the analog reference power supply 1 between the analog reference power supply 1 and the multiplexer 3.

FIG. 10 shows an example in which six bits of digital pixel data D1 to D3 are inputted from the outside, higher three bits D4 to D6 of these are used in selecting the voltage of the multiplexer 3, and lower three bits D1 to D3 are used in switching on/off of the capacity selecting switches (capacity dividing circuit) SW41 to SW43.

That is, by the bit string of the digital pixel data D1 to D3, the capacitors C11 to C14 of FIG. 10 can arbitrarily be connected in parallel or series, and the voltage can be outputted from between adjacent capacitors in accordance with the bit string of the digital pixel data D1 to D3. Specifically, a capacity between 0 and 7C is generated in accordance with the bit string of the digital pixel data D1 to D3, and by the capacity and capacity 8C of the capacitor C15, a voltage between voltage VH and voltage VL can be outputted.

In the circuit of FIG. 10, since a plurality of capacitors C11 to C14 are connected to an input stage of the output buffer 2, a capacity value of the input stage of the output buffer 2 becomes far larger than that of the circuit of FIG. 1 or the like. Therefore, due to the charging/discharging current by the capacity of the input stage, the voltage value of the analog reference power supply 1 easily fluctuates.

Therefore, in the fifth embodiment, the pre-buffers 4 are provided between the analog reference power supply 1 and the multiplexer 3, and the output voltage of the pre-buffer 4 is supplied to the multiplexer 3 for the predetermined period after the bit string of the digital pixel data D1 to D3 changes. Therefore, since the current to charge/discharge the parasitic capacitor C1 of the input terminal of the output buffer 2 flows through the pre-buffer 4, and does not flow through the analog reference power supply 1, the output voltage of the analog reference power supply 1 does not fluctuate.

In the above embodiments, the D/A conversion circuit in the signal line drive circuit 12 of the liquid crystal display device has been described, but the present invention can also be applied to the other objects, for example, to an audio D/A conversion circuit in which digital voice signals are converted to analog voice signals.

Figure 11:
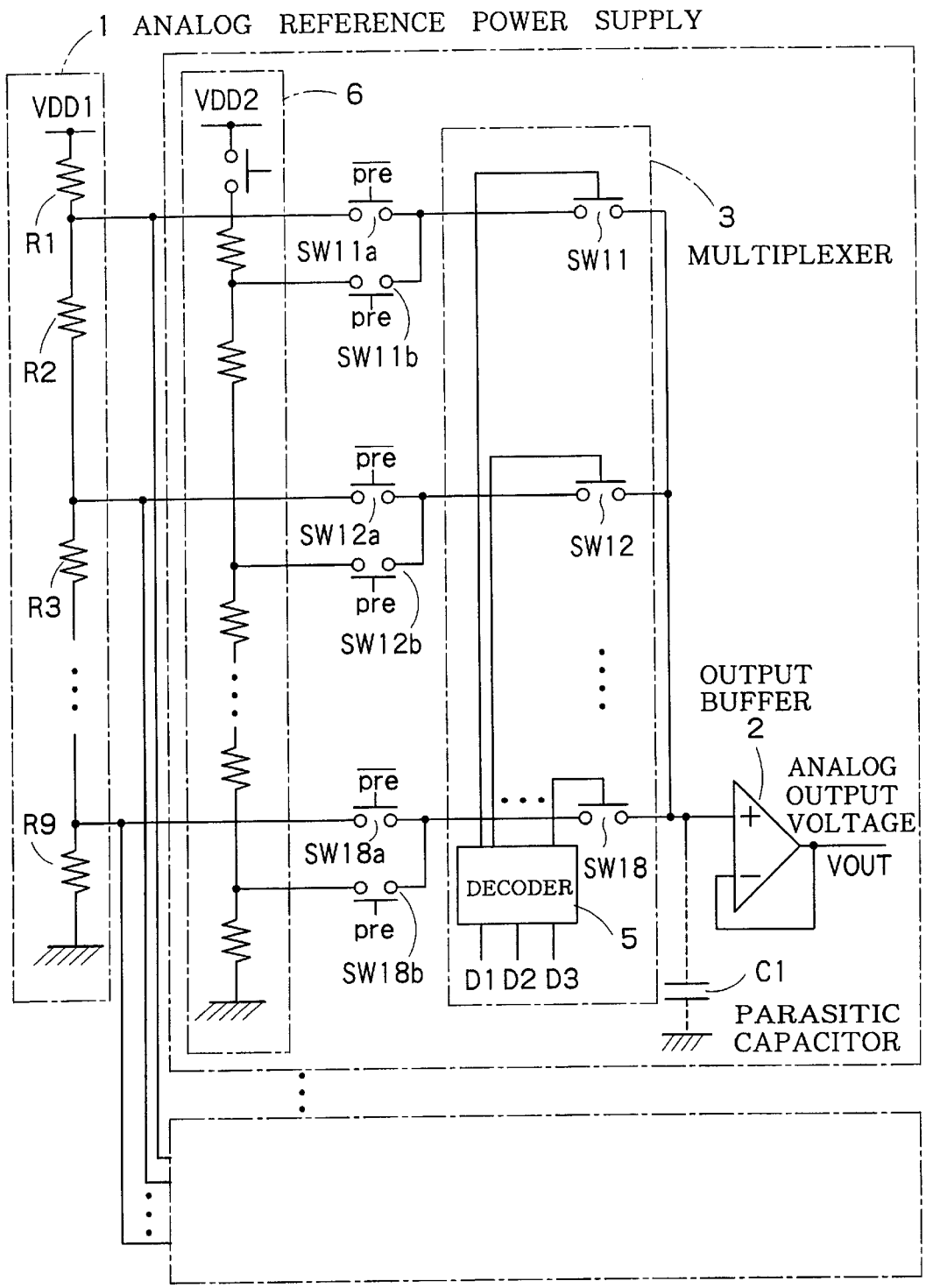
FIG. 11 is a diagram showing an example in which pre-buffers of FIG. 7 are replaced with a resistance voltage dividing circuit.
Figure 12:
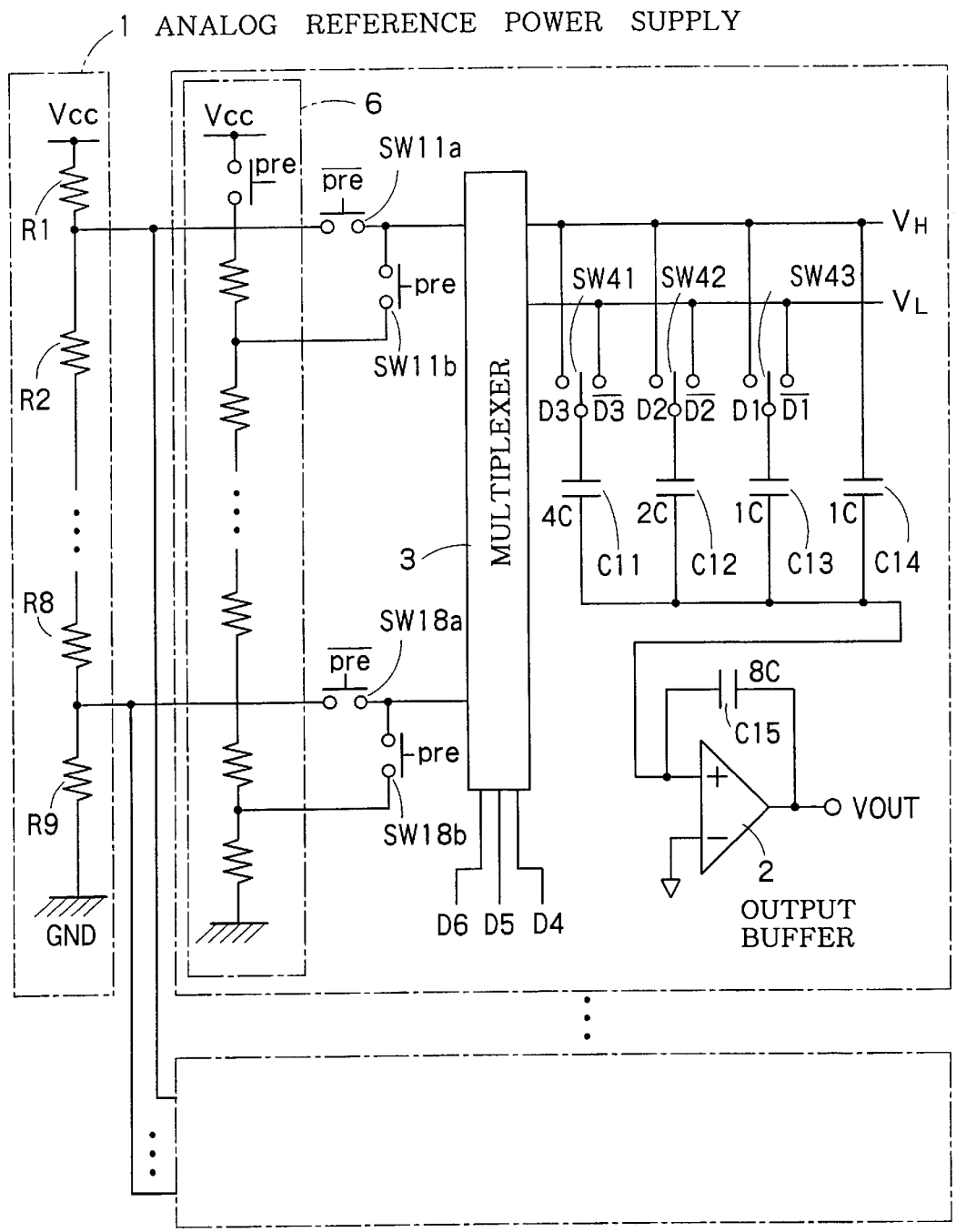
FIG. 12 is a diagram showing an example in which pre-buffers of FIG. 10 are replaced with the resistance voltage dividing circuit.

Moreover, instead of the pre-buffers 4 of the first, third, and fifth embodiments (FIGS. 3, 7, 10), the charging/discharging resistance voltage dividing circuit 6 of FIG. 6 may be connected. For example, FIG. 11 shows an example in which the pre-buffers 4 of FIG. 7 are replaced with the resistance voltage dividing circuit 6, and FIG. 12 shows an example in which the pre-buffers 4 of FIG. 10 are replaced with the resistance voltage dividing circuit 6. Moreover, FIG. 13 shows a modification of FIG. 12, and shows an example in which the resistance voltage dividing circuit 6 and a switch circuit 9 are provided behind the multiplexer 3.

In the above-described embodiments, the power supply voltage VDD1 of the analog reference power supply 1 and the power supply voltage VDD2 of the charging/discharging resistance voltage dividing circuit 6 may be supplied from separate power supply pads, but may be supplied from the same power supply pad. However, since the current flows through the charging/discharging resistance voltage dividing circuit 6 rather than through the analog reference power supply 1, a power supply pattern to supply the power supply voltage VDD2 is preferably formed to be thicker and shorter than a power supply pattern to supply the power supply voltage VDD1.

Furthermore, the number of bits of the digital pixel data D1 to D3, and the number of output buffers 2 formed inside the LSI chip are not particularly limited.

Additionally, in order to reduce the number of output terminals of the LSI chip, for example, all the signal lines may be driven by two LSI chips each having 48 outputs. In this case, switches are connected to the signal lines inside the pixel array substrate 11, and by simultaneously turning on/off at each set of a plurality of switches among these switches, the signal lines may be driven in sequence by block units.

What is claimed is:

1. A D/A conversion circuit provided with an analog reference power supply for using a first power supply voltage as a drive voltage and outputting a plurality of different voltages,
    a voltage selecting circuit configured to select one of said plurality of different voltages based on a string of digital data, and
    an output buffer configured to convert impedance of the voltage selected by said voltage selecting circuit, comprising:
        a charging/discharging voltage generating circuit configured to use a second power supply voltage as the drive voltage and to output a second power supply voltage correlated with said one of said plurality of different voltages of said analog reference power supply; and
        a current switchover circuit configured to switch a direction in which a current flows in such a manner that a charging/discharging current of an input parasitic capacitor of said output buffer passes through said charging/discharging voltage generating circuit for a predetermined period after said bit string of digital data changes, and in such a manner that said charging/discharging current passes through said analog reference power supply after said predetermined period elapses.

2. The D/A conversion circuit according to claim 1, wherein said charging/discharging voltage generating circuit uses said second power supply voltage as the drive voltage, and outputs a voltage correlated with the voltage selected by said voltage selecting circuit, and
    said output buffer converts the impedance of the output voltage of said voltage selecting circuit or said charging/discharging voltage generating circuit in accordance with a direction in which said current switchover circuit switches the current.

3. The D/A conversion circuit according to claim 2, wherein said charging/discharging voltage generating circuit has a pre-buffer for performing feedback control in such a manner that the output voltage becomes substantially equal to an input voltage.

4. The D/A conversion circuit according to claim 2, wherein said charging/discharging voltage generating circuit has a plurality of resistances connected in series,
    said analog reference power supply has a plurality of resistances connected in series, and
    resistance values of the plurality of resistances in said charging/discharging voltage generating circuit are set to be smaller than resistance values of the plurality of resistances in said analog reference power supply.

5. The D/A conversion circuit according to claim 4, wherein a resistance ratio of the plurality of resistances in said charging/discharging voltage generating circuit is set to be substantially equal to a resistance ratio of the plurality of resistances in said analog reference power supply.

6. The D/A conversion circuit according to claim 1, wherein said charging/discharging voltage generating circuit uses said second power supply voltage as the drive voltage, and outputs a plurality of voltages correlated with the output voltages of said analog reference power supply,
    said current switchover circuit is provided for each output voltage of said charging/discharging voltage generating circuit, outputs the corresponding output voltage of said charging/discharging voltage generating circuit for said predetermined period, and outputs the output voltage of said voltage selecting circuit after said predetermined period elapses, and
    said output buffer converts the impedance of the output voltage of said current switchover circuit.

7. The D/A conversion circuit according to claim 6, wherein said charging/discharging voltage generating circuit has a pre-buffer for performing feedback control in such a manner that the output voltage becomes substantially equal to an input voltage.

8. The D/A conversion circuit according to claim 6, wherein said charging/discharging voltage generating circuit has a plurality of resistances connected in series,
    said analog reference power supply has a plurality of resistances connected in series, and
    resistance values of the plurality of resistances in said charging/discharging voltage generating circuit are set to be smaller than resistance values of the plurality of resistances in said analog reference power supply.

9. The D/A conversion circuit according to claim 8, wherein a resistance ratio of the plurality of resistances in said charging/discharging voltage generating circuit is set to be substantially equal to a resistance ratio of the plurality of resistances in said analog reference power supply.

10. The D/A conversion circuit according to claim 1, wherein said charging/discharging voltage generating circuit uses said second power supply voltage as the drive voltage, and outputs a plurality of voltages correlated with output voltages of said analog reference power supply,
    said current switchover circuit is provided for each output voltage of said charging/discharging voltage generating circuit, outputs the corresponding output voltage of said charging/discharging voltage generating circuit for said predetermined period, and outputs the corresponding output voltage of said analog reference power supply after said predetermined period elapses,
    said voltage selecting circuit selects the output voltage of said current switchover circuit in accordance with the bit string of said digital data, and
    said output buffer converts the impedance of the output voltage of said voltage selecting circuit.

11. The D/A conversion circuit according to claim 10, wherein said charging/discharging voltage generating circuit has a pre-buffer for performing feedback control in such a manner that the output voltage becomes substantially equal to an input voltage.

12. The D/A conversion circuit according to claim 10, wherein said charging/discharging voltage generating circuit has a plurality of resistances connected in series,
    said analog reference power supply has a plurality of resistances connected in series, and resistance values of the plurality of resistances in said charging/discharging voltage generating circuit are set to be smaller than resistance values of the plurality of resistances in said analog reference power supply.

13. The D/A conversion circuit according to claim 12, wherein a resistance ratio of the plurality of resistances in said charging/discharging voltage generating circuit is set to be substantially equal to a resistance ratio of the plurality of resistances in said analog reference power supply.

14. The D/A conversion circuit according to claim 1, wherein said charging/discharging voltage generating circuit uses said second power supply voltage as the drive voltage, and outputs a plurality of voltages correlated with output voltages of said analog reference power supply, said voltage selecting circuit has a plurality of switch means connected between output terminals of said analog reference power supply and an input terminal of said output buffer, said charging/discharging voltage generating circuit has a plurality of buffers connected in parallel with said plurality of switch means, and said current switchover circuit supplies said second power supply voltage to said charging/discharging voltage generating circuit only for said predetermined period.

15. The D/A conversion circuit according to claim 14, further comprising a power supply switch circuit for supplying said second power supply voltage to said plurality of buffers only for the predetermined period after the bit string of said digital data changes.

16. The D/A conversion circuit according to claim 1, comprising a capacity dividing circuit for dividing a capacity of a plurality of capacitors based on bits other than bits of said digital data, and outputting a voltage in accordance with an output voltage of said voltage selecting circuit, said output buffer converting the impedance of the output voltage of said capacity dividing circuit.

17. The D/A conversion circuit according to claim 16, wherein said charging/discharging voltage generating circuit has a pre-buffer for performing feedback control in such a manner that the output voltage becomes substantially equal to an input voltage.

18. The D/A conversion circuit according to claim 16, wherein said charging/discharging voltage generating circuit has a plurality of resistances connected in series, said analog reference power supply has a plurality of resistances connected in series, and resistance values of the plurality of resistances in said charging/discharging voltage generating circuit are set to be smaller than resistance values of the plurality of resistances in said analog reference power supply.

19. The D/A conversion circuit according to claim 18, wherein a resistance ratio of the plurality of resistances in said charging/discharging voltage generating circuit is set to be substantially equal to a resistance ratio of the plurality of resistances in said analog reference power supply.

20. The D/A conversion circuit according to claim 1, wherein said predetermined period is a time correlated with a period in which an input parasitic capacitor of said output buffer is charged or discharged.

21. The D/A conversion circuit according to claim 1, comprising:

a first pattern for supplying said first power supply voltage to said analog reference power supply; and a second pattern for supplying said second power supply voltage to said charging/discharging voltage generating circuit, said first and second patterns being connected to a common pad, said second pattern being formed to be thicker and shorter than said first pattern.

22. A liquid crystal display device, comprising:

a pixel array portion in which a signal line and a scanning line are arranged, and pixel electrodes are formed in the vicinity of an intersection of the signal lines and the scanning lines, respectively;

a signal line drive circuit provided with the D/A conversion circuit according to claim 1 for driving each signal line; and a scanning line drive circuit for driving each scanning line, said signal line drive circuit converting digital data constituted of pixel display information to an analog pixel voltage by said D/A conversion circuit and supplying the voltage to the corresponding signal line.

* * * * *